(12) United States Patent
Kumar et al.

(10) Patent No.: US 12,316,326 B1
(45) Date of Patent: May 27, 2025

(54) DELAY CIRCUIT

(71) Applicant: Synopsys, Inc., Mountain View, CA (US)

(72) Inventors: Shishir Kumar, Uttar Pradesh (IN); Vinay Kumar, Aligarh (IN)

(73) Assignee: SYNOPSYS, INC., Sunnyvale, CA (US)

( * ) Notice: Subject to any disclaimer, the term of this patent is extended or adjusted under 35 U.S.C. 154(b) by 127 days.

(21) Appl. No.: 18/177,111

(22) Filed: Mar. 1, 2023

(51) Int. Cl.
*H03K 5/13* (2014.01)
*G11C 11/16* (2006.01)
*H03K 5/00* (2006.01)

(52) U.S. Cl.
CPC ............ *H03K 5/13* (2013.01); *G11C 11/1693* (2013.01); *H03K 2005/00202* (2013.01)

(58) Field of Classification Search
CPC .................. G11C 11/1693; H03K 5/13; H03K 2005/00202
See application file for complete search history.

(56) References Cited

U.S. PATENT DOCUMENTS

| | | | | |
|---|---|---|---|---|
| 5,610,561 A | * | 3/1997 | Zarrabian | H03K 3/03 331/49 |
| 7,760,124 B2 | * | 7/2010 | Trescases | G04F 10/005 327/295 |
| 8,063,675 B2 | * | 11/2011 | Igarashi | H03K 5/06 327/143 |
| 8,885,386 B2 | * | 11/2014 | Youn | G11C 11/1675 365/158 |

OTHER PUBLICATIONS

Antonyan, A. et al., "Embedded MRAM Macro for eFlash Replacement", 2018, 4 pages, IEEE.

* cited by examiner

*Primary Examiner* — Son L Mai
(74) *Attorney, Agent, or Firm* — Womble Bond Dickinson (US) LLP

(57) ABSTRACT

A delay circuit. In some embodiments, a non-transitory computer readable medium includes stored instructions, which when executed by a processor, cause the processor to generate a digital representation of a circuit including: a first inverter, having an input, an output, and two power supply connections; a first current source, electrically coupled in series between a power supply conductor and a power supply connection of the two power supply connections of the first inverter; and a ramp generator circuit, electrically coupled to the input of the first inverter.

14 Claims, 4 Drawing Sheets

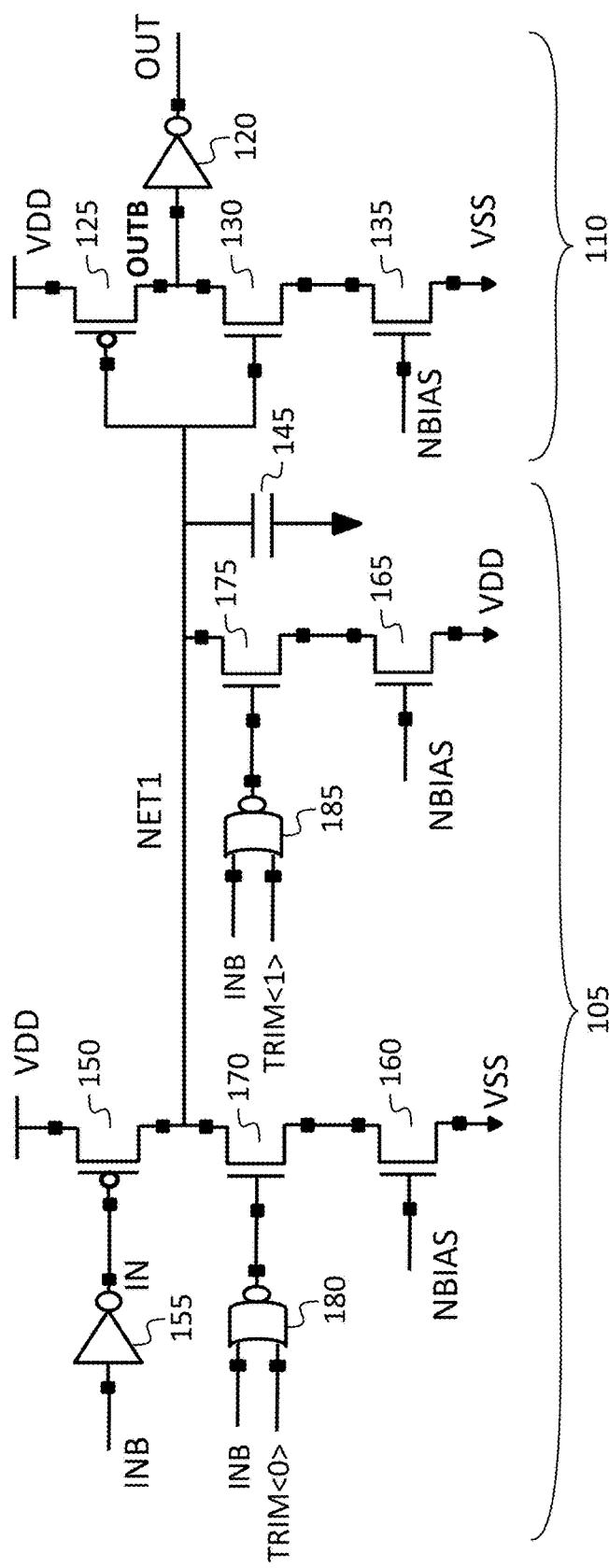
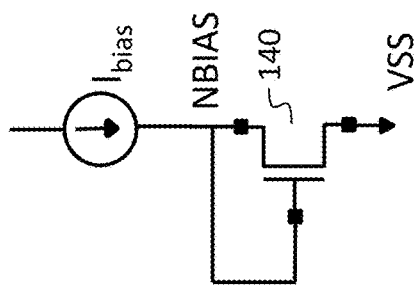
FIG. 1A
FIG. 1B

| Supply | Temperature | Delay circuit (ns) | Inverter-based delay (ns) |
|---|---|---|---|
| 1.53 | -40 | 12.0 | 16.9 |
| 2.00 | -40 | 11.8 | 11.8 |
| 1.53 | 150 | 12.0 | 19.4 |
| 2.00 | 150 | 11.8 | 14.1 |
| | max | 12.0 | 19.4 |
| | min | 11.8 | 11.8 |
| | max/min | 2% | 64% |

FIG. 2

DELAY CIRCUIT

TECHNICAL FIELD

The present disclosure relates to magnetoresistive random-access memory (MRAM), and more particularly to a delay circuit for interfacing with magnetoresistive random-access memory.

BACKGROUND

Magnetoresistive random-access memory (MRAM) is a type of nonvolatile random-access memory that employs magnetic domains to store data. Such memory may employ read and write operations in which there are delays between transitions in control lines (e.g., between 5 nanoseconds (ns) and 300 ns).

SUMMARY

According to an embodiment of the present disclosure, there is provided a non-transitory computer readable medium including stored instructions, which when executed by a processor, cause the processor to generate a digital representation of a circuit including: a first inverter, having an input, an output, and two power supply connections; a first current source, electrically coupled in series between a power supply conductor and a power supply connection of the two power supply connections of the first inverter; and a ramp generator circuit, electrically coupled to the input of the first inverter.

In some embodiments, the circuit further includes an output buffer having an input electrically coupled to the output of the first inverter.

In some embodiments, the first current source is a mirror transistor of a current mirror.

In some embodiments, the ramp generator circuit includes a capacitor, electrically coupled to the input of the first inverter.

In some embodiments, the ramp generator circuit further includes a second current source electrically coupled to the capacitor.

In some embodiments, the ramp generator circuit further includes a first switching transistor electrically coupled in series with the second current source.

In some embodiments, the ramp generator circuit further includes a third current source electrically coupled to the capacitor.

In some embodiments, the ramp generator circuit further includes a second switching transistor electrically coupled in series with the third current source.

In some embodiments: the ramp generator circuit further includes a fourth current source electrically coupled to the capacitor; the ramp generator circuit further includes a third switching transistor electrically coupled in series with the fourth current source; and a control terminal of the third switching transistor is electrically coupled to a control terminal of the second switching transistor.

According to an embodiment of the present disclosure, there is provided a circuit including: a first inverter, having an input, an output, and two power supply connections; a first current source, electrically coupled in series between a power supply conductor and a power supply connection of the first inverter; and a ramp generator circuit, electrically coupled to the input of the first inverter.

In some embodiments, the circuit further includes an output buffer having an input electrically coupled to the output of the first inverter.

In some embodiments, the first current source is a mirror transistor of a current mirror.

In some embodiments, the ramp generator circuit includes a capacitor, electrically coupled to the input of the first inverter.

In some embodiments, the ramp generator circuit further includes a second current source electrically coupled to the capacitor.

In some embodiments, the ramp generator circuit further includes a first switching transistor electrically coupled in series with the second current source.

In some embodiments, the ramp generator circuit further includes a third current source electrically coupled to the capacitor.

In some embodiments, the ramp generator circuit further includes a second switching transistor electrically coupled in series with the third current source.

In some embodiments: the ramp generator circuit further includes a fourth current source electrically coupled to the capacitor; the ramp generator circuit further includes a third switching transistor electrically coupled in series with the fourth current source; and a control terminal of the third switching transistor is electrically coupled to a control terminal of the second switching transistor.

According to an embodiment of the present disclosure, there is provided a method, including:
receiving, by a delay circuit, an input signal, the input signal having a transition, at a transition time; charging a capacitor during a time interval preceding the transition time; discharging the capacitor, through a current source, during a time interval following the transition time, until a voltage on the capacitor equals a transition voltage; and when the voltage on the capacitor equals the transition voltage, toggling an output signal of the delay circuit.

In some embodiments, the method further includes controlling a control signal of a magnetoresistive random-access memory with the output signal.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 1A is a schematic diagram of a delay circuit, in accordance with some embodiments of the present disclosure.

FIG. 1B is a schematic diagram of a portion of a current mirror, in accordance with some embodiments of the present disclosure.

FIG. 2 is a table of simulation results, in accordance with some embodiments of the present disclosure.

DETAILED DESCRIPTION

Figure 1C:
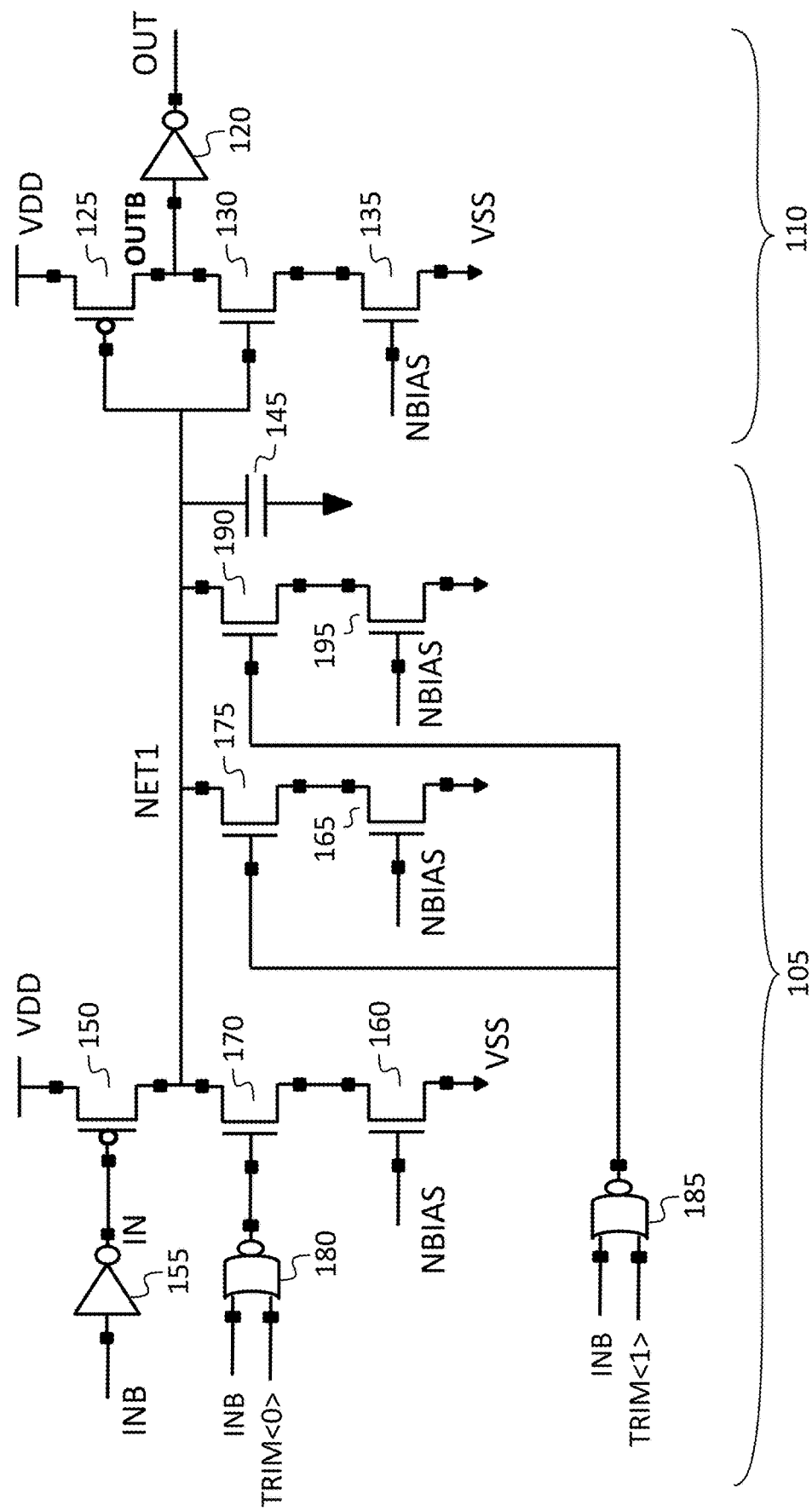
FIG. 1C is a schematic diagram of a delay circuit, in accordance with some embodiments of the present disclosure.

Aspects of the present disclosure relate to a delay circuit.

Magnetoresistive random-access memory (MRAM) may be used in various data processing and storage systems. Such memory may include a plurality of memory cells, each configured to receive a plurality of control signals. For example, each memory cell may be connected to a respective word line and to a respective bit line. An interface circuit may control reading data from, and writing data to, the MRAM. For example, to read a bit of data from a cell, the interface circuit may turn on the word line connected to the cell, and then wait an interval of time (or delay) (e.g., between 5 ns and 20 ns) before turning on a sense amplifier connected to the bit line that is connected to the cell. During a write operation, the delay between control signal transitions may be between 50 ns and 300 ns. Some methods of generating such delays, e.g., using multiple inverters connected in a cascade, may suffer from various flaws, including a relatively high sensitivity to variations in temperature and/or power supply voltage.

As such, in some embodiments, a delay circuit is employed that includes a capacitor charged (or discharged) by a current source, the delay being determined by the time interval required for the voltage on the capacitor to reach a transition voltage of a detector connected to the capacitor. In some embodiments, the current source is controllable, e.g., the current source may include multiple current sources connected in parallel, and configured to be turned on or off independently. Further, the detector may include a complementary pair of transistors, connected to form an inverter, with a current source connected in series with one of the power supply connections of the inverter. This series-connected current source may reduce the extent to which the transition voltage of the inverter varies with temperature and with power supply voltage.

Technical advantages of the present disclosure include, but are not limited to, the following. In some embodiments, the delay circuit is controllable (e.g., digitally controllable). The increments by which the delay may be changed and the range over which the delay may be adjusted by such digital control may be selected, in the design of the circuit, by the selection of the increments in which the current of the current source may be changed, and the range over which the current of the current source may be adjusted. In some embodiments, the amount by which the delay varies over a range of power supply voltages and operating temperatures is significantly less than the amount by which the delay of a cascade of inverters varies over the range of power supply voltages and operating temperatures. Moreover, in some embodiments, the present delay circuit provides internal timing for MRAM so it does not rely on an external clock. This helps to self-time to define read/write windows, where the read window is usually much shorter than the write window.

Referring to FIG. 1, in some embodiments, a delay circuit includes a ramp generator circuit 105 (which may generate a voltage ramp) and an output circuit 110. The output circuit 110 includes a first inverter operating as a detector (which detects whether its input is less than or greater than a transition voltage), and a second inverter 120 operating as an output buffer. The first inverter includes two transistors connected in series, e.g., a first transistor 125 (which may be a p-channel metal oxide semiconductor (PMOS) field effect transistor as shown) and a second transistor 130 (which may be an n-channel metal oxide semiconductor (NMOS) field effect transistor as shown). A first current source 135, which may be or may include a mirror transistor of a current mirror, may be connected between a power supply conductor (e.g., VSS as shown) and a power supply connection of the first inverter. In operation when the input signal INB (which may, for example, be connected to the (active low) word line) transitions from logic high to logic low, the output signal OUT (which may, for example, be connected to the (active low) bit line) may also, after some delay, transition from logic high to logic low. The digital control signal (discussed in further detail below) which may include, e.g., TRIM<0> and TRIM<1>, may be supplied by a control register (e.g., a set of flip flops) which may be programmed prior to operation for the timing requirements of the MRAM to which the circuit is to be connected. In some embodiments, two copies of the present delay circuit (each with a respective control register) may be used to control the control signal timing for read and write operations, respectively.

The first current source 135 may prevent significant current from flowing out of or into the output of the first inverter, so that the current flowing through each of the first transistor 125 and the second transistor 130 may be limited to the current of the first current source 135. The transistor of the first current source 135 may be weaker than (e.g., it may have a narrower channel than) the first transistor 125 and the second transistor 130. This may have the effect of reducing the extent to which the transition voltage of the first inverter (the voltage, at the input to the first inverter, at which the first inverter transitions between its two states, a state in which its output is logic high and a state in which its output is logic low) changes with temperature changes or with power supply voltage. The reference transistor 140 of the current mirror, which generates the current source bias voltage NBIAS, may be configured as shown in FIG. 1i, e.g., it may be a diode-connected NMOS transistor connected to a bias current source.

The ramp generator circuit 105 may include a capacitor 145 that, when the input INB is logic high, is charged to the positive supply voltage VDD, through a first switching transistor 150 (driven by a third inverter 155), and that, when the input INB is logic low (and the first switching transistor 150 is turned off), discharges through one or more current sources (e.g., a second current source 160 and a third current source 165 as shown) each of which is connected in series with a respective one of one or more corresponding switching transistors (e.g., a second switching transistor 170, and a third switching transistor 175, as shown). The discharging of the capacitor 145, when the input INB is logic low, may cause the voltage at the input of the first inverter (on the node NET1) to change at a constant rate (equal to the ratio of (i) the total current drawn by the current sources to (ii) the capacitance of the capacitor 145). As such, the delay may be inversely proportional to the total current drawn by the current sources, e.g., the delay may be equal to (or substantially equal to) C (VDD−VT)/I, where C is the capacitance of the capacitor 145, VT is the transition voltage (the voltage at which the output of the inverter changes between logic low and logic high), and I is the total current drawn by the current sources.

A digital control signal having one or more bits (e.g., two bits, TRIM<0> and TRIM<1>) may control the switching transistors 170, 175 of the current sources 160, 165, and thereby control the rate at which the capacitor 145 discharges when INB is logic low. The following table shows the current I for various values of TRIM<0> and TRIM<1>, where I0 is the current flowing through the second current source 160 when the second switching transistor 170 is turned on:

| TRIM<1> | TRIM<0> | I |
|---------|---------|------|
| 0 | 0 | 0 |
| 0 | 1 | I0 |
| 1 | 0 | 2 I0 |
| 1 | 1 | 3 I0 |

This digital control signal may control the delay between (i) the transition from logic high to low, in INB, and (ii) the corresponding, delayed transition from logic high to low in the output signal OUT of the delay circuit. Each bit of the digital control signal may control whether the current of corresponding current source is drawn from the capacitor 145. These currents may have magnitudes arranged as powers of two; for example, the current controlled by bit 1 of the digital control signal (TRIM<1>) may be twice as great as the current controlled by bit 0 of the digital control signal (TRIM<0>). Similarly, in an embodiment with a digital control signal that is more than two bits wide, bit 2 of the digital control signal may control a current that is twice as great as the current controlled by bit 1 of the digital control signal, and, in an embodiment with a digital control signal that is n bits wide, bit n of the digital control signal may control a current that is $2^n$ times as great as the current controlled by bit 0. In some embodiments the digital control signal may include between 4 and 12 bits, providing between 16 and 4096 different, substantially uniformly spaced, current values, and between 15 and 4095 different possible selectable delay values (the delay value corresponding to substantially zero current being unused, in some embodiments).

The control of the switching transistors 170, 175 of the current sources 160, 165 may be accomplished by a first NOR gate 180 and a second NOR gate 185 (or a combination of other logic gates providing the function of the two NOR gates 180 185), as shown. When INB is low and the corresponding bit of the digital control signal is low, the output of the NOR gate is high, turning on the corresponding one of the switching transistors 170, 175 of the current sources 160, 165. Each bit of the digital control signal may be active low, e.g., a low value may cause the corresponding switching transistor to be turned on, when INB is also low.

The mirror transistors of the current sources 135, 160, 165 may all be the same (e.g., may all have the same channel width (and gate length)), or they may be different (e.g., having different channel widths), and each of them may be the same as, or different from (e.g., having a different channel width from) the reference transistor 140 of the current mirror. For example, in the circuit of FIG. 1A, the mirror transistor of the third current source 165 may have channel that is twice as wide as the mirror transistor of the second current source 160, so that bit 1 of the digital control signal (which controls the third switching transistor 175) controls twice as much current as bit 0 of the digital control signal.

FIG. 1C shows an embodiment in which the mirror transistors of the current sources 160, 165 are the same (e.g., have the same channel width) and in which (as in the circuit of FIG. 1A) bit 1 of the digital control signal controls twice as much current as bit 0 of the digital control signal. In the embodiment of FIG. 1C this is accomplished by connecting a fourth switching transistor 190 and a fourth current source 195 (connected in series with the fourth switching transistor 190) in parallel with the third switching transistor 175 and the third current source 165, the control terminal (e.g., the gate) of the fourth switching transistor 190 being connected to the control terminal (e.g., the gate) of the third switching transistor 175 (both control terminals being connected to the output of the second NOR gate 185), and the fourth current source 195 including or being a mirror transistor having the same channel width as the mirror transistor of the second current source 160.

FIG. 2 is a table of simulation results, showing the delay produced by the present delay circuit and (ii) by inverters connected in cascade, for four different combinations of power supply voltage (in Volts) and temperature (in Celsius) (in FIG. 2, "max" and "min" refer to delay values). It may be seen that the variation in the delay, at 2%, is less than 64% of that of a cascade of inverters (e.g., in the example of FIG. 2, it is less than $\frac{1}{30}^{th}$ of that of a cascade of inverters).

Figure 3:
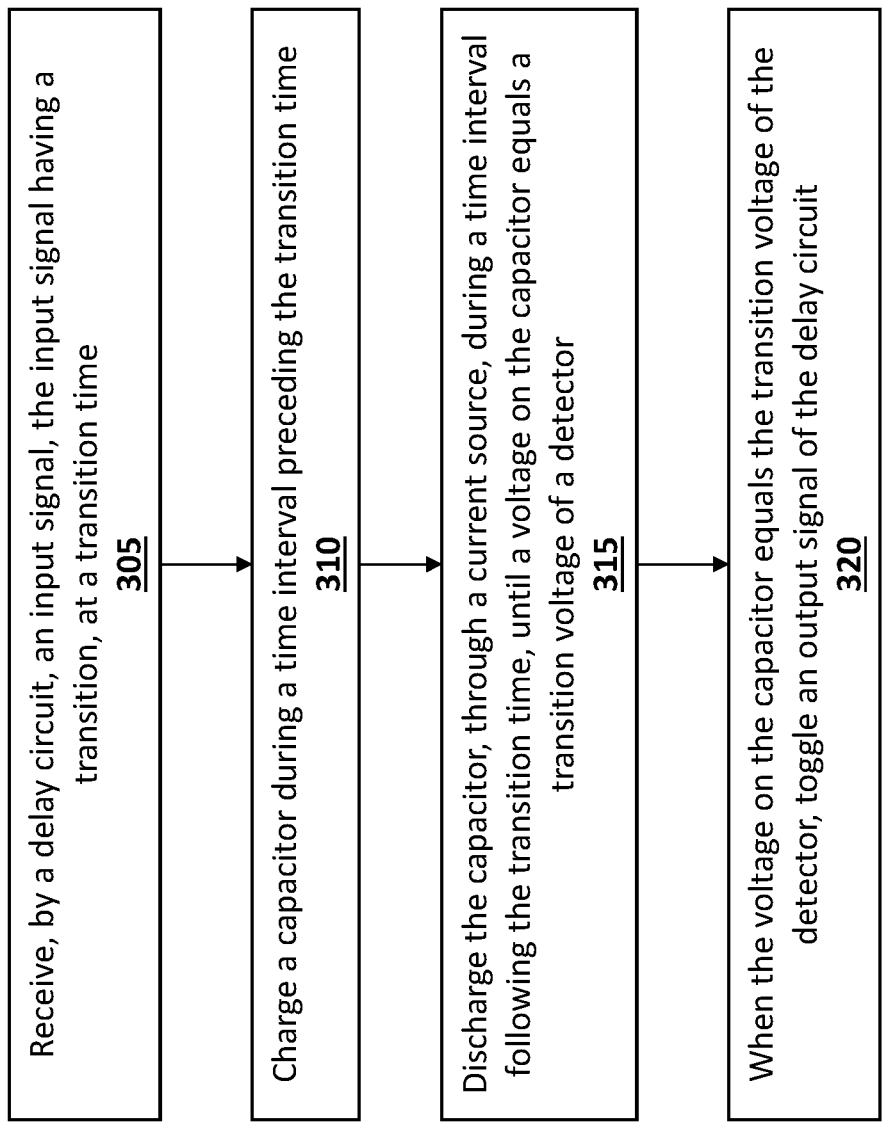
FIG. 3 is a flow chart of a method, in accordance with some embodiments of the present disclosure.

FIG. 3 is a flow chart of a method, in some embodiments. The method may include receiving, at 305, by a delay circuit, an input signal (at the input INB), the input signal having a transition, at a transition time; charging a capacitor (e.g., the capacitor 145), at 310, during a time interval preceding the transition time; discharging the capacitor (e.g., the capacitor 145), at 315, through a current source (e.g., the second current source 160), during a time interval following the transition time, until a voltage on the capacitor equals a transition voltage; and when the voltage on the capacitor equals the transition voltage, toggling (e.g., switching from low to high or from high to low), at 320, an output signal (e.g., the output OUT) of the delay circuit.

In some embodiments, the design of the delay circuit may be stored as instructions in a computer readable medium, such that when a processor (e.g., a processing circuit) executes the instructions, the processor generates a digital representation of the circuit (e.g., mask files suitable for fabricating the circuit as part of an integrated circuit). As used herein, a "ramp generator" or "ramp generator circuit" is a circuit the output voltage of which changes linearly with time.

As used herein, the word "or" is inclusive, so that, for example, "A or B" means any one of (i) A, (ii) B, and (iii) A and B. As used herein, a "transistor" is a three-terminal device, having two current-carrying terminals (e.g., the source and the drain) and a control terminal (e.g., the gate). It will be understood that when an element is referred to as being "directly connected" or "directly coupled" to another element, there are no intervening elements present. As used herein, "generally connected" means connected by an electrical path that may contain arbitrary intervening elements, including intervening elements the presence of which qualitatively changes the behavior of the circuit. As used herein, "connected" means (i) "directly connected" or (ii) connected with intervening elements, the intervening elements being ones (e.g., low-value resistors or inductors, or short sections of transmission line) that do not qualitatively change the behavior of the circuit. When a first element and a second element are connected with one or more intervening elements, the one or more intervening elements may be said to be "connected between" the first element and the second element. When two or more transistors are "connected in series" it means that the current-carrying terminals of the transistors are connected in series, such that if all of the transistors are turned on, a current may flow through them in series.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A non-transitory computer readable medium comprising stored instructions, which when executed by a processor, cause the processor to generate a digital representation of a circuit comprising:
   a first inverter, having an input, an output, and two power supply connections;
   a first current source, electrically coupled in series between a power supply conductor and a power supply connection of the two power supply connections of the first inverter; and
   a ramp generator circuit, electrically coupled to the input of the first inverter, the ramp generator circuit comprising:
      a capacitor, electrically coupled to the input of the first inverter;
      a second current source electrically coupled to the capacitor; and
      a first switching transistor electrically coupled in series between the second current source and the capacitor.

2. The non-transitory computer readable medium of claim 1, wherein the circuit further comprises an output buffer having an input electrically coupled to the output of the first inverter.

3. The non-transitory computer readable medium of claim 1, wherein the first current source is a mirror transistor of a current mirror.

4. The non-transitory computer readable medium of claim 1, wherein the ramp generator circuit further comprises a third current source electrically coupled to the capacitor.

5. The non-transitory computer readable medium of claim 4, wherein the ramp generator circuit further comprises a second switching transistor electrically coupled in series with the third current source.

6. The non-transitory computer readable medium of claim 5, wherein:
   the ramp generator circuit further comprises a fourth current source electrically coupled to the capacitor;
   the ramp generator circuit further comprises a third switching transistor electrically coupled in series with the fourth current source; and
   a control terminal of the third switching transistor is electrically coupled to a control terminal of the second switching transistor.

7. A circuit comprising:
   a first inverter, having an input, an output, and two power supply connections;
   a first current source, electrically coupled in series between a power supply conductor and a power supply connection of the first inverter; and
   a ramp generator circuit, electrically coupled to the input of the first inverter, the ramp generator circuit comprising:
      a capacitor, electrically coupled to the input of the first inverter;
      a second current source electrically coupled to the capacitor; and
      a first switching transistor electrically coupled in series between the second current source and the capacitor.

8. The circuit of claim 7, further comprising an output buffer having an input electrically coupled to the output of the first inverter.

9. The circuit of claim 7, wherein the first current source is a mirror transistor of a current mirror.

10. The circuit of claim 7, wherein the ramp generator circuit further comprises a third current source electrically coupled to the capacitor.

11. The circuit of claim 10, wherein the ramp generator circuit further comprises a second switching transistor electrically coupled in series with the third current source.

12. The circuit of claim 11, wherein:
   the ramp generator circuit further comprises a fourth current source electrically coupled to the capacitor;
   the ramp generator circuit further comprises a third switching transistor electrically coupled in series with the fourth current source; and
   a control terminal of the third switching transistor is electrically coupled to a control terminal of the second switching transistor.

13. A method, comprising:
   receiving, by a delay circuit, an input signal, the input signal having a transition, at a transition time;
   charging a capacitor during a time interval preceding the transition time;
   discharging the capacitor, through a current source, during a time interval following the transition time, until a voltage on the capacitor equals a transition voltage; and
   when the voltage on the capacitor equals the transition voltage, toggling an output signal of the delay circuit.

14. The method of claim 13, further comprising controlling a control signal of a magnetoresistive random-access memory with the output signal.

* * * * *